United States Patent
Chiang

(10) Patent No.: US 9,282,670 B2
(45) Date of Patent: Mar. 8, 2016

(54) ELECTRONIC APPARATUS AND STAND THEREOF

(71) Applicant: Wistron Corporation, New Taipei (TW)

(72) Inventor: Chun-Yi Chiang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 146 days.

(21) Appl. No.: 13/916,880

(22) Filed: Jun. 13, 2013

(65) Prior Publication Data

US 2014/0029176 A1  Jan. 30, 2014

(30) Foreign Application Priority Data

Jul. 30, 2012 (TW) .............................. 101127490 A

(51) Int. Cl.
| | |
|---|---|
| *F16M 11/20* | (2006.01) |
| *H05K 7/14* | (2006.01) |
| *G06F 1/16* | (2006.01) |
| *F16M 11/10* | (2006.01) |
| *F16M 11/24* | (2006.01) |

(52) U.S. Cl.
CPC ............... *H05K 7/14* (2013.01); *F16M 11/105* (2013.01); *F16M 11/2092* (2013.01); *F16M 11/24* (2013.01); *G06F 1/1601* (2013.01); *F16M 2200/048* (2013.01); *F16M 2200/063* (2013.01); *G06F 2200/1614* (2013.01)

(58) Field of Classification Search
USPC ......... 248/917, 918, 919, 920, 922, 923, 146, 248/149, 407, 423; 361/679.21, FOR. 104
See application file for complete search history.

(56) References Cited

U.S. PATENT DOCUMENTS

| | | | | |
|---|---|---|---|---|
| 5,411,134 | A | * | 5/1995 | Temple et al. ................. 206/753 |
| 7,643,276 | B2 | * | 1/2010 | Shin ......................... 361/679.06 |
| 7,644,897 | B2 | * | 1/2010 | Shin ........................... 248/176.1 |
| 7,677,509 | B2 | | 3/2010 | Jang |
| 7,708,239 | B2 | * | 5/2010 | Watanabe et al. ........... 248/125.7 |
| 7,789,355 | B2 | * | 9/2010 | Gan et al. ....................... 248/157 |
| 7,810,776 | B2 | | 10/2010 | Long et al. |
| 7,997,555 | B2 | * | 8/2011 | Lee et al. ....................... 248/371 |
| 8,074,948 | B2 | * | 12/2011 | Zou et al. ...................... 248/157 |
| 8,567,748 | B2 | * | 10/2013 | Zhou et al. .................... 248/688 |
| 8,628,052 | B2 | * | 1/2014 | Lee et al. ................... 248/289.11 |
| 8,960,627 | B2 | * | 2/2015 | Atallah et al. ................ 248/371 |

FOREIGN PATENT DOCUMENTS

| | | |
|---|---|---|
| TW | M365611 U1 | 9/2009 |
| TW | M425312 U1 | 3/2012 |

* cited by examiner

*Primary Examiner* — Alfred J Wujciak

(74) *Attorney, Agent, or Firm* — Muncy, Geissler, Olds & Lowe, P.C.

(57) ABSTRACT

A stand includes a base, a rotating element and a cover. The base includes a main body and a position device combined moveably with the main body. The rotating element combines rotatably with the position device to form a pivoting portion and is moved with the position device. The rotating element includes a guiding pillar. The cover combines with the main body, and the cover includes at least one guiding structure. The guiding pillar can be moved along the at least one guiding structure when the position device is moved, and a rotation operation of the guiding pillar can be limited by the at least one guiding structure when the guiding pillar is rotated with the rotating element.

10 Claims, 14 Drawing Sheets

US 9,282,670 B2

ELECTRONIC APPARATUS AND STAND THEREOF

BACKGROUND OF THE INVENTION

1. Field of the Invention

The present invention relates to a stand of an electronic apparatus, and more particularly, to a stand that limits the rotation function of an electronic apparatus relative to the stand.

2. Description of the Related Art

A general desktop computer system is formed with a computer host and a display screen that are two standalone devices. Due to developments of the computer related technology an all-in-one computer system integrated the computer host and the display screen into an unity is appeared (such as iMAC from Apple, etc). For saving the space occupied by the computer system, the computer host is disposed into the display screen in designs, such that the display screen of such computer system is heavier than a general display screen.

In order to fulfill the requirement of current operation system or application, the display type of frame is also not only major for the conventional landscape frame, it can also generate the corresponding portrait frame. For the display of the portrait frame, a user must rotate the display screen 90 degree, to match the display position of the corresponding portrait completely. Nevertheless, for a display screen, the horizontal length is larger than the vertical width in design (such as a screen with 4:3 aspect ratio); in recent years, it even trends to adapt widescreen specification of screen size (such as 16:9 aspect ratio). No matter for which aforementioned screen specification, when the screen is rotated from the landscape frame to the portrait frame, the screen is easily to hit a surface of a table during the rotation process if the bottom of the screen is too close to the surface of the table. Accordingly, the rotation operation of the screen cannot be completed smoothly and even it causes damage to the screen.

SUMMARY OF THE INVENTION

A main object of the present invention is to provide a stand that limits the rotation function of an electronic apparatus relative to the stand.

In order to achieve the abovementioned object, the stand of the present invention includes a base, a rotating element and a cover. The base includes a main body and a position device combined moveably with the main body; the rotating element combines rotatably with the position device to form a pivoting portion, and the rotating element moves with the position device, and the rotating element includes a guiding pillar. The cover combines with the main body, and the cover includes at least one guiding structure. The guiding pillar moves along the at least one guiding structure when the position device moves, and the guiding pillar is limited by the at least one guiding structure while rotating with the rotating element. It includes to limit a rotation position, a rotation direction, or a rotation angle of the guiding pillar.

In one embodiment of the present invention, each guiding structure includes a straight-line portion, a arc portion, and a blocking portion, and the arc portion includes a first end and a second end; wherein the first end connects with the straight-line portion, and the second ends connects with the blocking portion. When the guiding pillar moves to the first end of the arc portion, the pivoting portion of the rotating element is located at a center position of a circle corresponding to the arc portion, so that the guiding pillar moves along the arc portion when the rotating element rotates.

In another embodiment of the present invention, the stand further includes a strengthening element, and the guiding structure further includes a hollow portion; wherein the hollow portion is disposed on a side of guiding pillar moved along the guiding structure, and the hollow portion provides installation for the strengthening element so that the guiding pillar contacts with the strengthening element directly.

Accordingly the present invention uses the guiding structure in coordination with the guiding pillar, and the rotating element is allow to proceed with corresponding rotation operation only after the rotating element moves to a specific height. It can avoid an electronic apparatus combined the stand of the present invention to cause crashed damage by a careless operation from a user. At the same time, it also provides steady and safe adjustment effect to the electronic apparatus.

DETAILED DESCRIPTION OF THE PREFERRED EMBODIMENT

The technical content of the invention will become more apparent from the following detailed description of several preferred embodiments.

Figure 1:
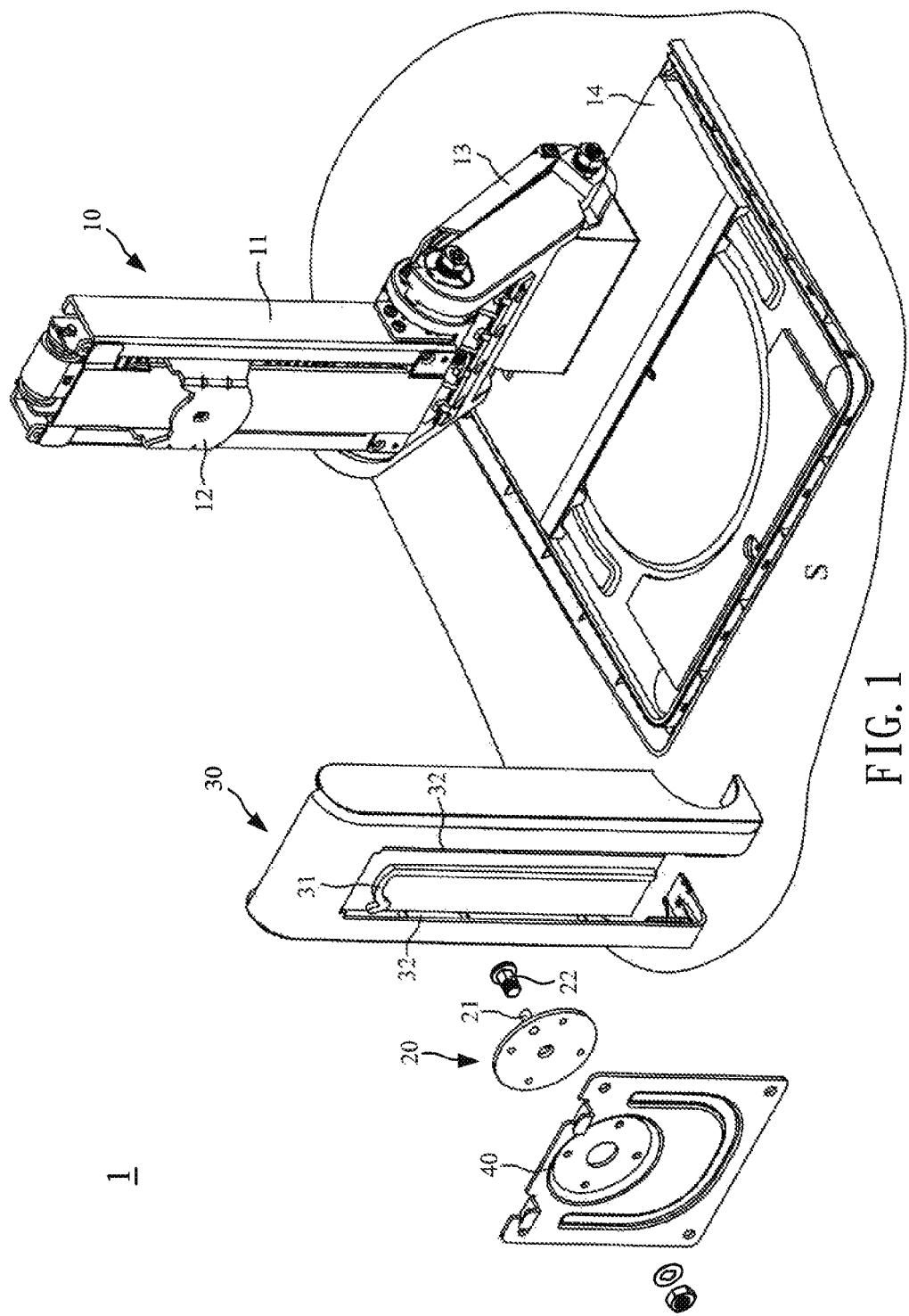
FIG. 1 is a diagram illustrating a first embodiment of the stand of the present invention.
Figure 2:
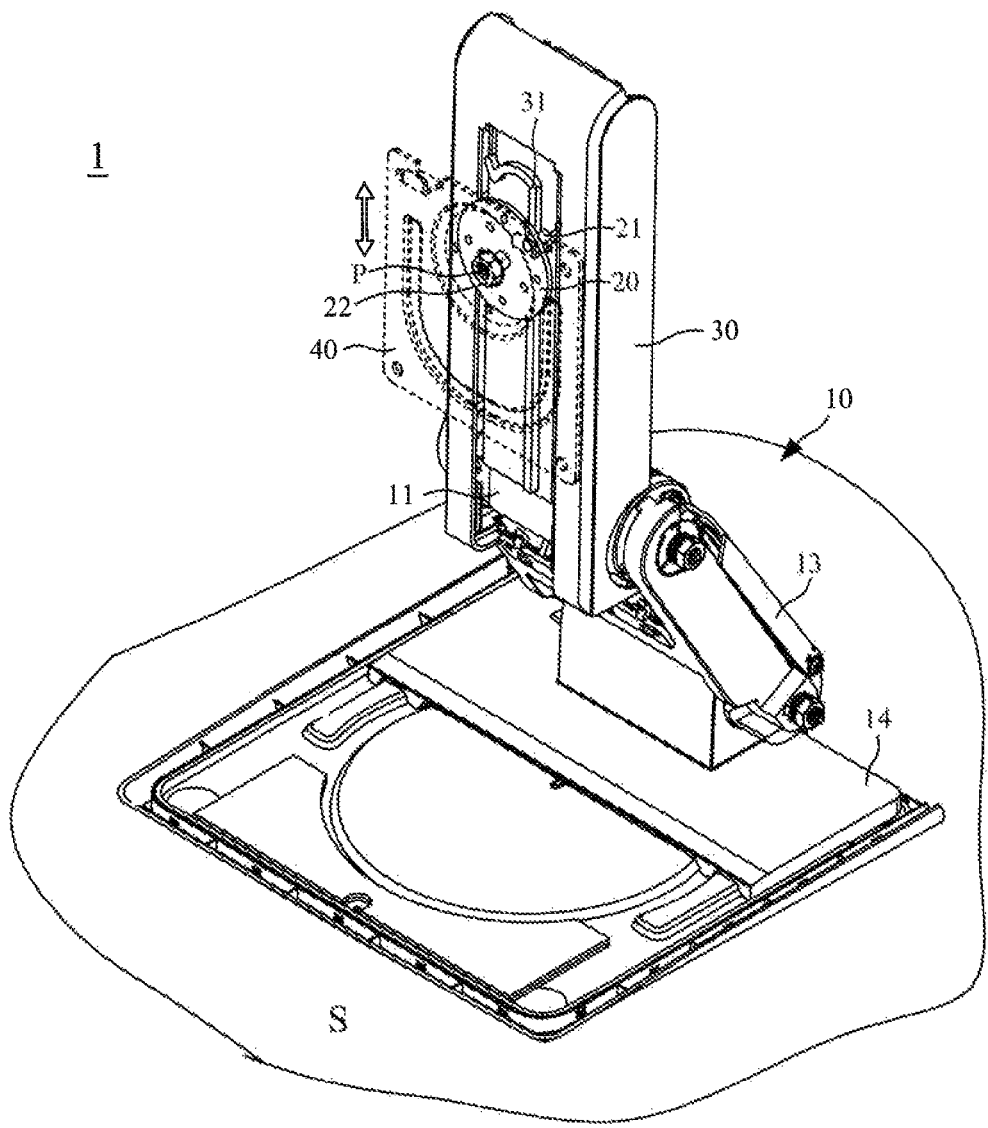
FIG. 2 is a structural exploded view of the first embodiment of the stand of the present invention.

Please refer to FIG. 1 and FIG. 2. FIG. 1 is a diagram illustrating a first embodiment of the stand of the present invention; FIG. 2 is a structural exploded view of the first embodiment of the stand of the present invention. The stand 1 of the present invention can be placed on a plane (such as a flat surface of a desk, ground or any other similar supporting plane), and the stand 1 is used to combine with an electronic apparatus (not shown in FIG.) to provide adjustment functions like positioning altitude or/and angle . . . etc, to the electronic apparatus. In one embodiment of the present invention, the electronic apparatus can be a display screen, an integrated computer system or other similar electronic apparatus, but the present invention is not limited to this.

As shown in FIG. 1 and FIG. 2, the stand 1 of the present invention includes a base 10, a rotating element 20 and a cover 30. The base 10 is put on a plane S. The base 10 includes a main body 11 and a position device 12, and the position device 12 combines moveably with the main body 11. In this embodiment, the position device 12 uses a structure element with built-in position springs, such that the position device 12 moves relative to the main body 11 and along a substantial straight-line direction to any position and be fixed. The position device 12 is general prior art design and thus is not described in detail. The base 10 further includes at least one moving element 13 and a supporting portion 14. The supporting portion 14 is used to fix onto the plane S, and two ends of the at least one moving element 13 are connected pivotally to the main body 11 and the supporting portion 14 respectively. Then, the base 10 forms a multi-degree of freedom of a movement adjustment structure by means of the at least one moving element 13 in coordination with the main body 11, but the present invention is not limited to this. For example, the main body 11 can also be fixed on the supporting portion 14 directly, to provide adjustment effect by means of the position device 12 only.

The rotating element 20 combines rotatably with the position device 12. In this embodiment, the rotating element 20 is fixed on the position device 12 by a screwing element 22 to form a pivoting portion P and rotates relative to the position device 12. The rotating element 20 moves with the position device 12 together. The rotating element 20 includes a guiding pillar 21 disposed on a surface which the rotating element 20 faces to the position device 12, and the guiding pillar 21 can correspondingly move or rotate with the rotating element 20. In this embodiment, the rotating element 20 uses a circular-plate structure, but the present invention is not limited to this. The rotating element 20 can also use a structure element with other forms.

The cover 30 combines with the main body 11, and the position device 12 moves relative to the main body 11. In this embodiment, the position device 12 penetrates through the cover 30 to combine with the rotating element 20, such that the position device 12 can move outside the cover 30 relative to the main body 11. The cover 30 is combined with the main body 11 by a mounting method, and the cover 30 includes at least a sliding slot 32, wherein each sliding slot 32 extends inwards from the edge of the cover 30 to form a straight-line slot. Therefore, when the cover 30 is combined with the main body 11, the position device 12 is allowed to penetrate through the at least one sliding slot 32 to move relative to the main body 11.

The cover 30 further includes at least one guiding structure 31. Each guiding structure 31 protrudes out the surface of the cover 30 and faces to the rotating element 20, and the disposed position of each guiding structure 31 is corresponding to the guiding pillar 21 of rotating element 20. When the position device 12 moves relative to the main body 11, the guiding pillar 21 can move along the at least one guiding structure 31 to maintain the stability of the position device 12 during moving or positioning. By means of the structure configuration of the at least one guiding structure 31, a rotation operation of the guiding pillar 21 with the rotation of the rotating element 20 is limited. The rotation operation of the guiding pillar 21 limited by the at least one guiding structure 31 includes to limit a rotation position, a rotation direction, or a rotation angle of the guiding pillar 21.

Furthermore, in this embodiment, the stand 1 of the present invention further includes a fixing frame 40 (shown as dotted lines in FIG. 2) for combining with the electronic apparatus to move relative to the main body 11. The fixing frame 40 is combined with the rotating element 20, such that the fixing frame 40 rotates with the rotating element 20 relative to the base 10. The fixing frame 40 also moves with the rotating element 20 and the position device 12 relative to the main body 11.

Figure 3:
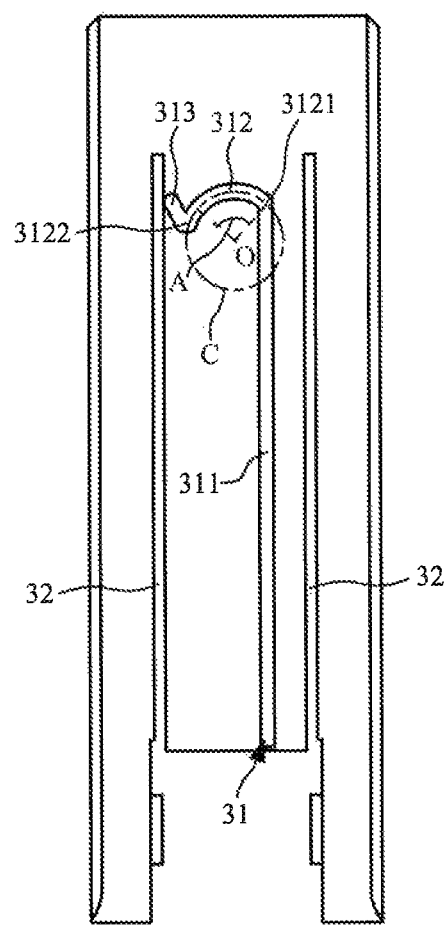
FIG. 3 is a diagram illustrating the first embodiment of the cover of the stand of the present invention.

Please refer to FIG. 3, which is a diagram illustrating the first embodiment of the cover 30 of the stand of the present invention. As shown in FIG. 1 and FIG. 3, in this embodiment, the cover 30 includes a single guiding structure 31, and the guiding structure 31 includes a straight-line portion 311, a arc portion 312, and a blocking portion 313. The straight-line portion 311 is used to limit the guiding pillar (not shown in FIG.) to move only along the extended direction of both ends of the straight-line portion 311, to limit the rotation position of the guiding pillar.

The arc portion 312 is used to have the guiding pillar proceed with a curve movement along the arc portion 312 when the guiding pillar rotates. By disposing the arc portion 312 on different sides relative to the straight-line portion 311, the rotation directions of the guiding pillar can be limited. The arc portion 312 includes a first end 3121 and a second end 3122; the first end 3121 connects with the straight-line portion 311, and the second ends 3122 connects with the blocking portion 313. Since the arc portion 312 is a partial arc structure of a circle C, the arc portion 312 has a corresponding circular-center position O. In this embodiment, the shape of the arc portion 312 is shown in quarter-circular arc, and the arc portion 312 is disposed on the left side of the straight-line portion 311. Such that the guiding pillar can rotate counter-clockwise along the arc portion 312, but the disposed position of the arc portion 312 is not limited to this.

The blocking portion 313 is used to limit the guiding pillar to move over the second end 3122 of the arc portion 312 to provide a blocking effect. Therefore, the rotation angle of the guiding pillar can be limited by means of the blocking portion 313 in coordination with the arc length of the arc portion 312. In this embodiment, a central angle A corresponding to the arc length of the arc portion 312 is around 90 degree substantially, namely the rotation angle of the guiding pillar is limited to 90 degree. The disposed type and quantity of the guiding structure 31 can be changed according to different designs, not limited to this embodiment.

Figure 4A:
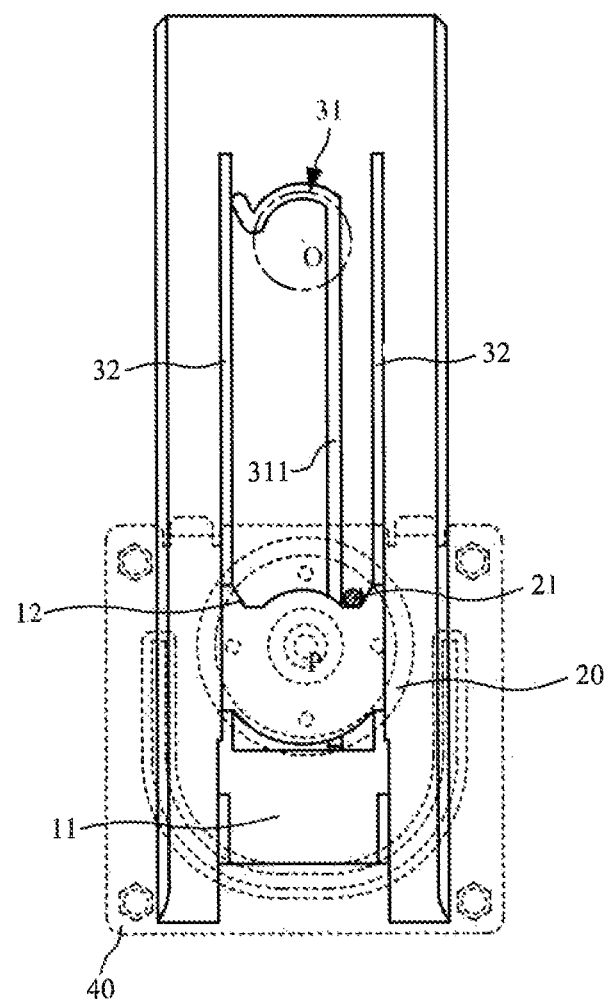
FIG. 4(a) is a diagram illustrating the position device of the stand of the present invention drives the rotating element.
Figure 4B:
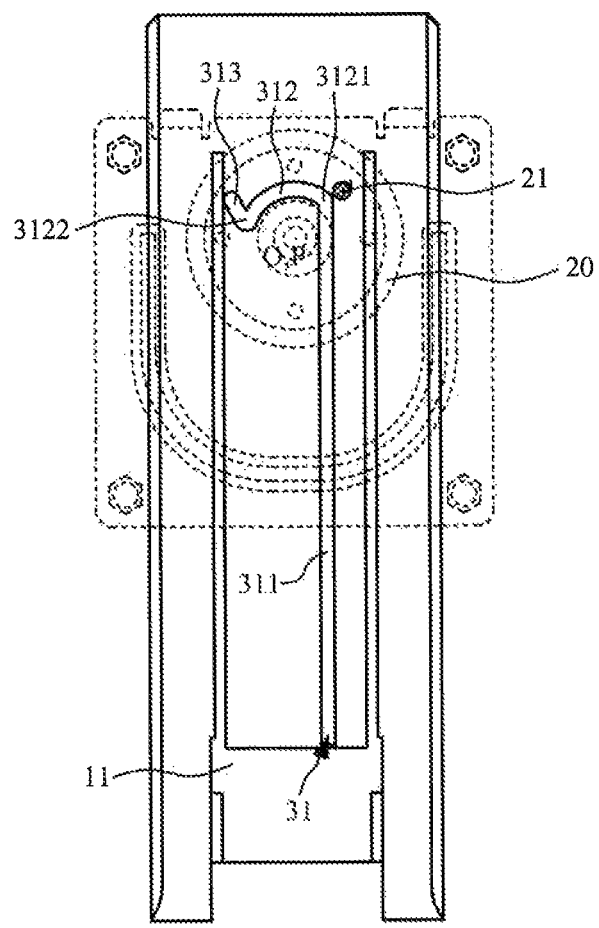
FIG. 4(b) is a diagram illustrating the rotating element of the stand of the present invention moves to the rotatable position.
Figure 4C:
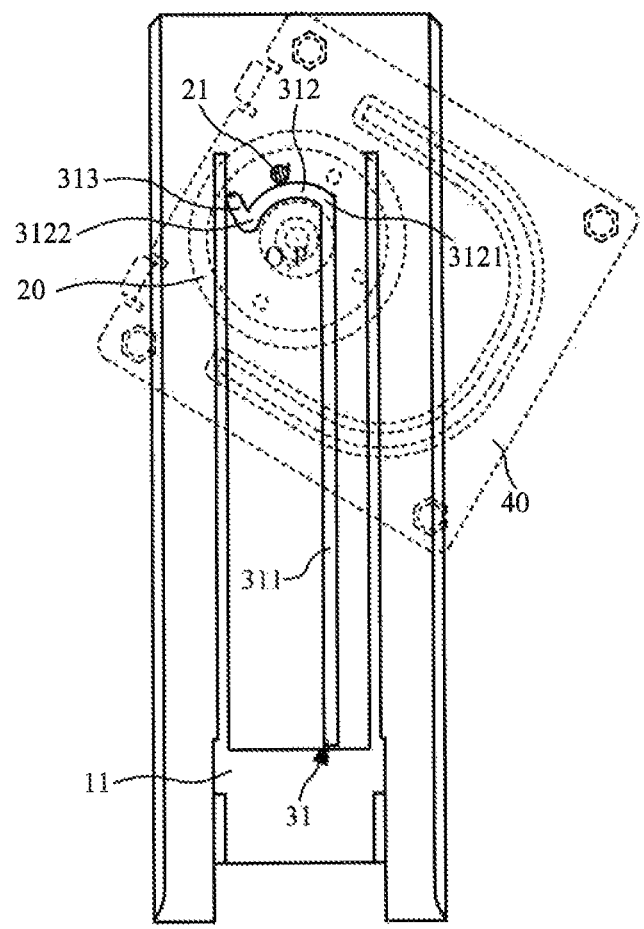
FIG. 4(c) is a diagram illustrating the guiding pillar of the stand of the present invention moves along the arc portion.
Figure 4D:
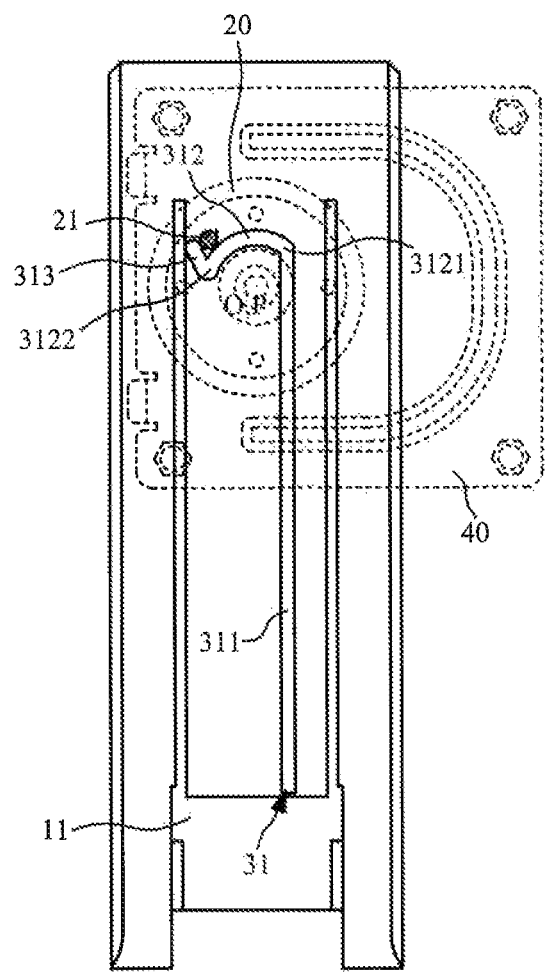
FIG. 4(d) is a diagram illustrating the stand of the present invention after the rotation movement of the rotating element.

Please refer to FIG. 4(a) to FIG. 4(d) together. FIG. 4(a) is a diagram illustrating the position device 12 of the stand 1 of the present invention drives the rotating element 20; FIG. 4(b) is a diagram illustrating the rotating element 20 of the stand 1 of the present invention moves to the rotatable position; FIG. 4(c) is a diagram illustrating the guiding pillar 21 of the stand 1 of the present invention moves along the arc portion 312; FIG. 4(d) is a diagram illustrating the stand 1 of the present invention after the rotation movement of the rotating element 20. It should be noted that, in order to clearly show the operation relationship between the guiding pillar 21 and the guiding structure 31, the rotating element 20 and the fixing frame 40 are illustrated with dotted lines, and the position device 12 is not shown in FIG. 4(b) to FIG. 4(d).

As shown in FIG. 4(a), when the position device 12 of the stand 1 of the present invention moves relative to the main body 11 and along the at least one sliding slot 32 to proceed a substantial straight-line movement or positioning, the rotating element 20 and the fixing frame 40 move with the position device 12 together. At this time, the guiding pillar 21 is blocked by the straight-line portion 311 of the guiding structure 31, such that the rotating element 20 cannot rotate counterclockwise by the pivoting portion P as a central-center. The guiding pillar 21 is also blocked by the position device 12 in opposite direction, such that the rotating element 20 also cannot rotate clockwise by the pivoting portion P as the central-center. Thus, the guiding pillar 21 of the rotating element 20 can only move along the straight-line portion 311 of the guiding structure 31 to proceed a substantial straight-line movement. Accordingly, when the position device 12 is located at a lower position or an inappropriate position relative to the main body 11, the rotation of the rotating element 20 can be limited by the corresponding structure design. Damage of the electronic apparatus during rotating can be avoided when the electronic apparatus is too close to the plane.

As shown in FIG. 4(b), when the guiding pillar 21 of the rotating element 20 moves with the position device and along the straight-line portion 311 to the first end 3121 of the arc portion 312 (namely the joint part of the straight-line portion 311 and the arc portion 312), the pivoting portion P of the rotating element 20 is located at the central-center position O corresponding to the arc portion 312, to form a rotatable position. At this time, the guiding pillar 21 is not blocked by the straight-line portion 311, such that the rotating element 20 can rotate in counterclockwise direction by the pivoting portion P as a central-center and toward the left side of the straight-line portion 311. Thus, the guiding pillar 21 rotates with the rotating element 20 and move along the arc portion 312, as shown in FIG. 4(c). After the rotating element 20 rotates to a fixed position (such as rotate 90 degree), because the guiding pillar 21 is blocked by the blocking portion 313 at the second end 3122 of the arc portion 312, the rotating element 20 cannot rotate in counterclockwise direction continuously so as to generate a positioning effect after the rotation, as shown in FIG. 4(d).

Contrarily, when the rotating element 20 rotated to the fixed position is forced to rotate in clockwise direction, the guiding pillar 21 moves along the arc portion 312 from the second end 3122 toward the first end 3121, and then back to the status as shown in FIG. 4(b). At this time, the rotating element 20 can adjust its height position relative to the main body 11 again with the movement of the position device.

Accordingly, only when the guiding pillar 21 moves to the disposed position of the arc portion 312, the rotating element 20 can be allowed to perform the rotation operation, the rotation direction, and the rotation angle are limited by the guiding structure 31. Therefore, the stand 1 of the present invention only needs to dispose the arc portion 312 of the guiding structure 31 at an appropriate height from the plane where the stand is placed onto (such as half of the length of the diagonal of the combined electronic apparatus); it makes sure the rotation operation of the electronic apparatus is not interfered by the plane, and the security and stability for execution of the rotation operation can be improved.

Figure 5A:
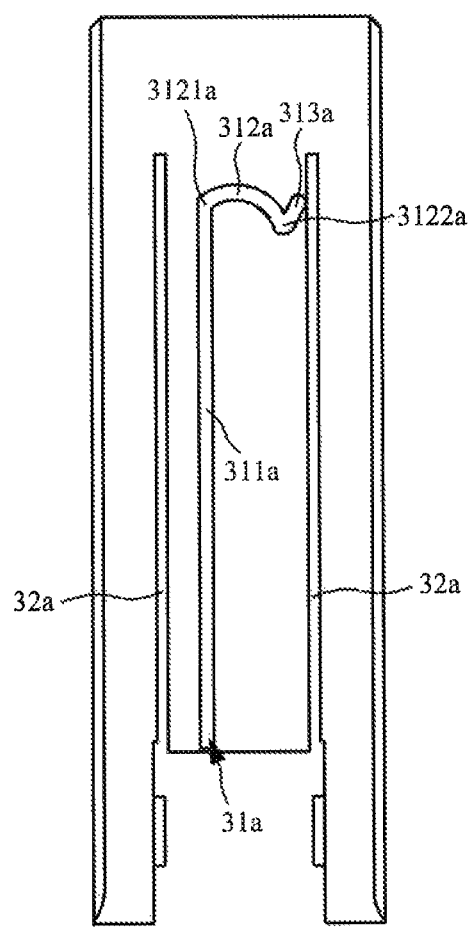
FIG. 5(a) is a diagram illustrating a second embodiment of the cover of the stand of the present invention.
Figure 5B:
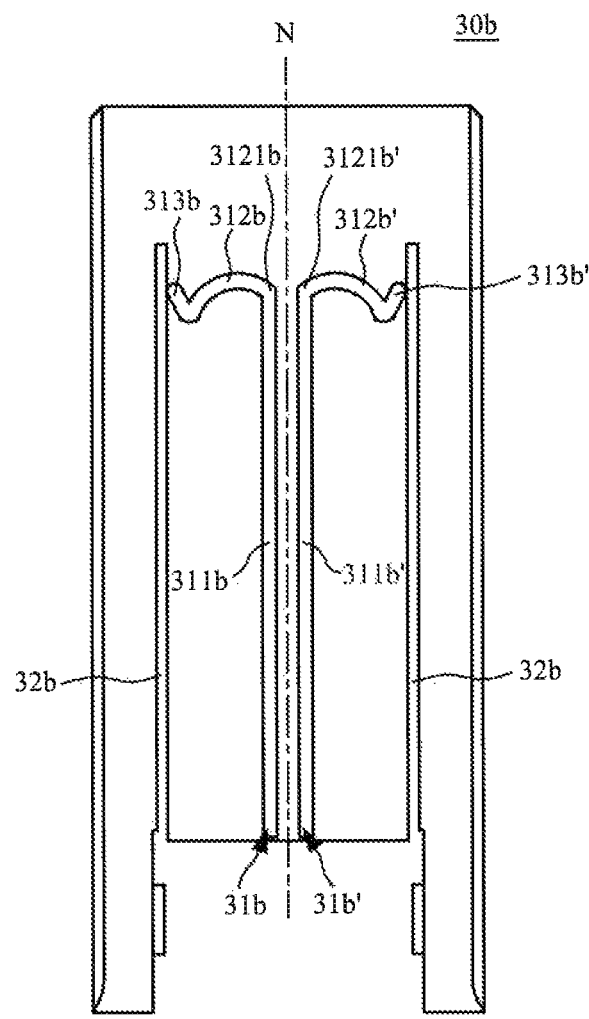
FIG. 5(b) is a diagram illustrating a third embodiment of the cover of the stand of the present invention.
Figure 5C:
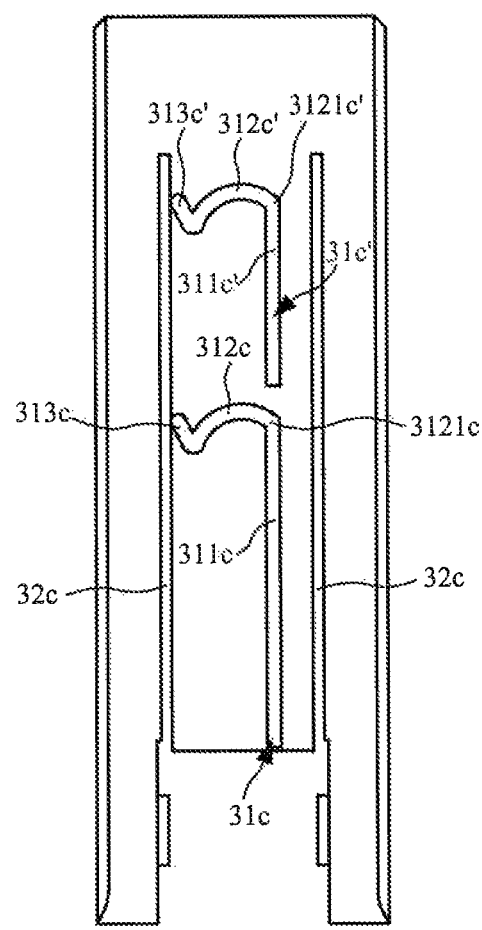
FIG. 5(c) is a diagram illustrating a forth embodiment of the cover of the stand of the present invention.

Please refer to FIG. 5(a) to FIG. 5(c) together. FIG. 5(a) is a diagram illustrating a second embodiment of the cover 30a of the stand of the present invention; FIG. 5(b) is a diagram illustrating a third embodiment of the cover 30b of the stand of the present invention; FIG. 5(c) is a diagram illustrating a forth embodiment of the cover 30c of the stand of the present invention. The second embodiment to the forth embodiment all are variations of the aforementioned first embodiment.

As shown in FIG. 5(a), in the second embodiment, the cover 30a also includes a single guiding structure 31a. The arc portion 312a and the blocking portion 313a are disposed on the right side of the straight-line portion 311a, such that the guiding pillar (not shown in FIG. 5(a)) is limited by the guiding structure 31a and can only move toward the second end 3122a in clockwise direction when the guiding pillar moves to the first end 3121a of the arc portion 312a. It provides an embodiment in contrast with the aforementioned first embodiment.

As shown in FIG. 5(b), in the third embodiment, the cover 30b includes two guiding structure 31b, 31b', and the structure types and the positions of the two guiding structure 31b, 31b' are disposed symmetrically based on a centerline N of the cover 30b. It means that the guiding structure 31b has the arc portion 312b disposed on the left side of the straight-line portion 311b, and the guiding structure 31b' has the arc portion 312b' disposed on the right side of the straight-line portion 311b'. Accordingly, when the guiding pillar (not shown in FIG.) moves to the corresponding position between the first end 3121b of the arc portion 312b and the first end 3121b' of the arc portion 312b', it can be chosen to perform the rotation operation of the guiding pillar in clockwise direction along the arc portion 312b' or in counterclockwise direction along the arc portion 312b by a user. It provides an embodiment with variant rotation operations for different directions.

As shown in FIG. 5(c), in the forth embodiment, the cover 30c also includes two guiding structure 31c, 31c', and the two guiding structure 31c, 31c' are disposed by vertical alignment with the same structure type; two guiding structures 31c, 31c' constitute two arc portions 312c, 312c' located at the same side but with different height. For example, the guiding structure 31c has the arc portion 312c at the left side of the straight-line portion 311c, and the guiding structure 31c' has the arc portion 312c' at the left side of the straight-line portion 311c'; the arc portion 312c and the arc portion 312c' are disposed at different height. Accordingly, no matter whether the guiding pillar (not shown in FIG.) moves to the first end 3121c of the arc portion 312c or to the first end 3121c' of the arc portion 312c', the rotation operation of the guiding pillar in counterclockwise direction along the arc portion 312c or the arc portion 312c' can be perform. It provides an embodiment with variant rotation operations for different heights.

Figure 6:
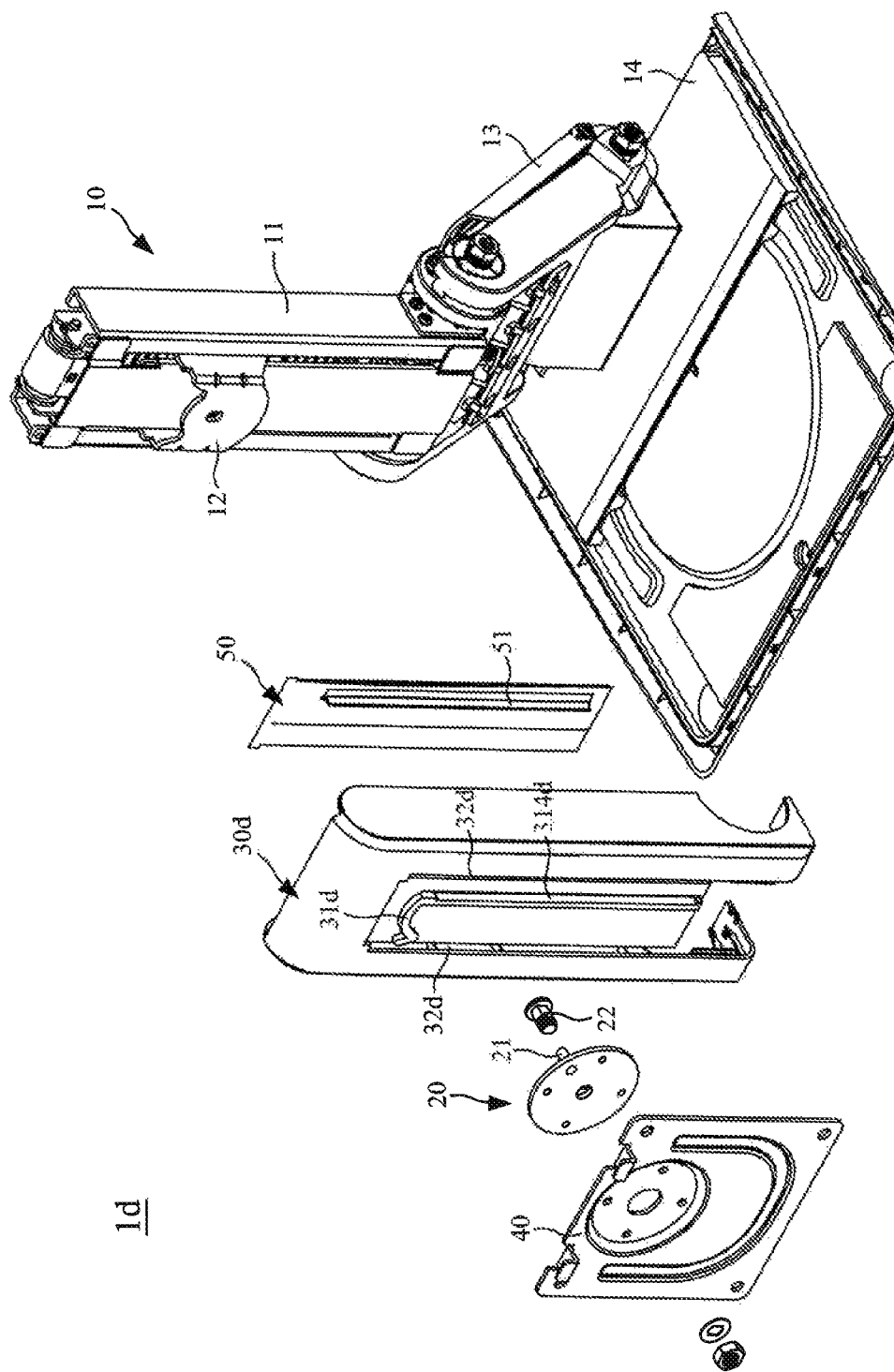
FIG. 6 is a structural exploded view of a fifth embodiment of the stand of the present invention.
Figure 7:
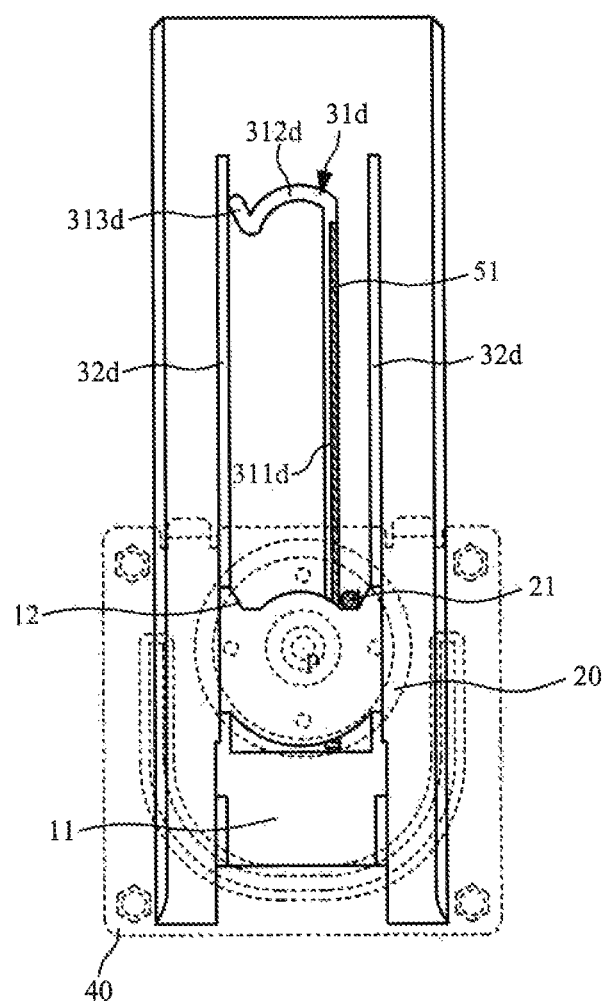
FIG. 7 is a front view of the fifth embodiment of the stand of the present invention.

Please refer to FIG. 6 and FIG. 7 together. FIG. 6 is a structure exploded view of a fifth embodiment of the stand 1d of the present invention; FIG. 7 is a front view of the fifth embodiment of the stand 1d of the present invention. The fifth embodiment is a variant of the aforementioned first embodiment. As shown in FIG. 6, in this embodiment, the stand 1d of the present invention further includes a strengthening element 50, and the strengthening element 50 includes a strengthening portion 51 embossed onto its surface. The cover 30d includes a single guiding structure 31d, and the guiding structure 31d further includes a hollow portion 314d. The hollow portion 314d is disposed on a side of the guiding pillar 21 moved along the guiding structure 31d, and the strengthening portion 51 of the strengthening element 50 penetrates through the hollow portion 314d to contact with the guiding pillar 21 directly. The strengthening portion 51 provides the guiding structure 31d a better blocking and wear-resisting effect to the guiding pillar 21. In this embodiment, the hollow portion 314 is disposed correspondingly on the right side of the straight-line portion 311d of the guiding structure 31, such that the strengthening portion 51 of the strengthening element 50 penetrates through the hollow portion 314 to contact with the guiding pillar 21 which moves along the straight-line portion 311d. It should be noted that the hollow portion 314d can also disposed extendedly on the arc portion 312d and even on the blocking portion 313d, and the strengthening portion 51 also changes its structure type in coordination with the hollow portion 314d; but the present invention is not limited to this.

Furthermore, in this embodiment, the cover 30*d* is made of plastic material (such as plastics), and the strengthening element 50 is made of metallic material (such as iron) to enhance the strength of the structure; but the materials of each aforementioned structure element is not limited to this embodiment.

Figure 8:
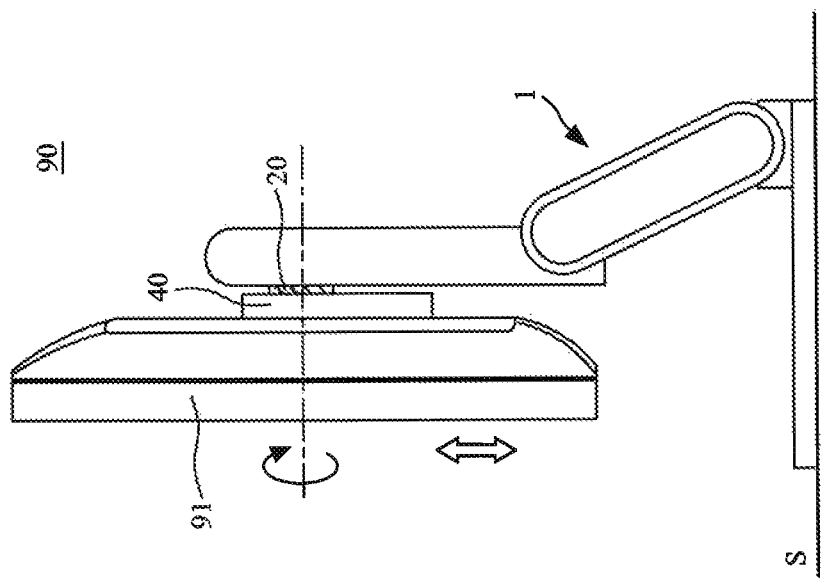
FIG. 8 is a diagram illustrating an electronic apparatus of the present invention.
Figure 9:
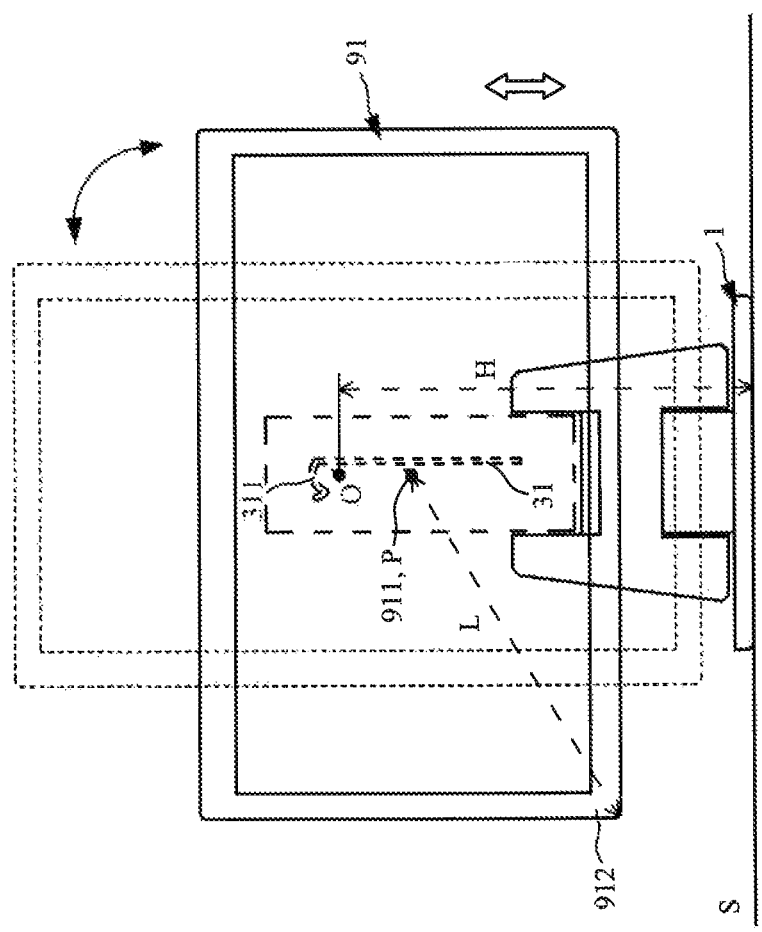
FIG. 9 is a diagram illustrating the main body of the electronic apparatus of the present invention executes a rotation operation.

Please refer to FIG. 8 and FIG. 9 together. FIG. 8 is a diagram illustrating an electronic apparatus 90 of the present invention; FIG. 9 is a diagram illustrating the main body 91 of the electronic apparatus 90 of the present invention executes a rotation operation.

As shown in FIG. 8, the electronic apparatus 90 of the present invention includes a device main body 91 and the stand 1 as aforementioned. The stand 1 is placed on the plane S and combines with the device main body 91 by the fixing frame 40. By the structure design of the stand 1, the device main body 91 rotates or/and moves in substantial straight-line with the fixing frame 40 and the rotating element 20 to adjust the position of the device main body 91. The related structure and operation method of the stand 1 are disclosed in aforementioned embodiments, so it would not be described in detail.

As shown in FIG. 9, the device main body 91 includes a center position 911 and at least one corner position 912, and the center position 911 is corresponding to the pivoting portion P of the rotating element of the stand 1. A height H between the plane S and the center position O corresponding to the arc portion 312 of the guiding structure 31 of the stand 1 is not less than a distance L from the center position 911 to any corner position 912. Accordingly, when the device main body 91 moves with the fixing frame 40 of the stand 1 to a rotatable position (namely the position of the arc portion 312 of the guiding structure 31), the device main body 91 can rotate by the center position 911 as a central-center; at this time, the height H is not less than the distance L, so any corner position 911 of the device main body 91 is not interfered by the plane S during the device main body 91 rotating. It also provides limitation effect of rotation when the device main body 91 moves to other non-rotatable position.

As described above, the objectives, means, and effectiveness in the present invention are different from the characteristics in the prior art. It should be noted that the embodiments described above are for illustrating the principles and effects of the present invention, and not for limiting the scope of the present invention. Any person skilled in the art shall be able to make modifications and changes to the embodiments without departing from the technical principle and spirit of the present invention. The claims of the present invention within the scope of protection are described below.

What is claimed is:

1. A stand for supporting a display screen, comprising:
   a base, including a main body and a position device combined moveably with the main body, wherein the position device is adapted to support a fixing frame of the display screen
   a rotating element combined rotatably with the position device to form a pivoting portion, the rotating element moving with the position device, and the rotating element including a guiding pillar; and
   a cover, combined with the main body, the cover including at least one guiding structure and at the least one the guiding structure includes a straight-line portion an arc portion and a blocking portion, wherein the guiding pillar moves along the straight-line portion when the position device is moving and the guiding pillar is limited by the arc portion when the guiding pillar rotates with the rotating element, wherein the arc portion includes a first end and a second end; the first end connects with the straight-line portion, and the second end connects with the blocking portion, wherein the blocking portion to provide a blocking effect on the guiding pillar.

2. The stand as claimed in claim 1, wherein a rotation position, a rotation direction, or a rotation angle of a rotation operation of the guiding pillar is limited by the at least one guiding structure.

3. The stand as claimed in claim 1, wherein the arc portion is a quarter-circular arc.

4. The stand as claimed in claim 1, wherein the pivoting portion of the rotating element is located on a center position of a circle corresponding to the arc portion when the guiding pillar moves to the first end of the arc portion, so that the guiding pillar moves along the arc portion when the rotating element rotates.

5. The stand as claimed in claim 1, wherein the arc portion is disposed relative to the left side of the straight-line portion, and the guiding pillar rotates counterclockwise along the arc portion.

6. The stand as claimed in claim 1, wherein the arc portion is disposed relative to the right side of the straight-line portion, and the guiding pillar rotates clockwise along the arc portion.

7. The stand as claimed in claim 1, wherein the cover further includes at least one sliding slot, the position device penetrates through the at least one sliding slot to move relative to the main body.

8. The stand as claimed in claim 1, wherein the cover further includes two guiding structure, and the two guiding structure are disposed with vertical alignment or symmetrically based on a centerline of the cover.

9. The stand as claimed in claim 1, further includes a strengthening element, and the guiding structure further includes a hollow portion; the hollow portion is disposed on a side of the guiding pillar moved along the guiding structure, and the strengthening element is disposed at the hollow portion, such that the guiding pillar contacts with the strengthening element directly.

10. The stand as claimed in claim 1, further includes the fixing frame combined with the rotating element to rotate with the rotating element relative to the base.

* * * * *